(12) United States Patent
Motoki

(10) Patent No.: US 7,359,247 B2
(45) Date of Patent: Apr. 15, 2008

(54) READ-OUT CIRCUIT IN SEMICONDUCTOR MEMORY DEVICE

(75) Inventor: Tomohisa Motoki, Habikino (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 82 days.

(21) Appl. No.: 11/490,999

(22) Filed: Jul. 21, 2006

(65) Prior Publication Data

US 2007/0019469 A1    Jan. 25, 2007

(30) Foreign Application Priority Data

Jul. 22, 2005    (JP)    ............................. 2005-212557

(51) Int. Cl.
*G11C 11/34*    (2006.01)

(52) U.S. Cl. ..................... 365/185.2; 365/210
(58) Field of Classification Search ............. 365/185.2, 365/210, 207, 185.21
See application file for complete search history.

(56) References Cited

U.S. PATENT DOCUMENTS 5,267,202 A * 11/1993 Dallabora et al. ....... 365/185.2
5,638,326 A * 6/1997 Hollmer et al. .......... 365/185.2
6,404,677 B2 * 6/2002 Lee ......................... 365/185.2
6,930,922 B2    8/2005 Mori et al.
2002/0186586 A1 * 12/2002 Conte et al. ............. 365/185.2

FOREIGN PATENT DOCUMENTS

| JP | 10-501361 A | 2/1998 |
| JP | 2004-63018 A | 2/2004 |
| WO | WO-95/34073 A1 | 12/1995 |

* cited by examiner

*Primary Examiner*—Anh Phung
(74) *Attorney, Agent, or Firm*—Morrison & Foerster LLP

(57) ABSTRACT

A read-out circuit comprises a read-out voltage generator circuit converting a memory cell current into a read-out voltage, a reference voltage generator circuit supplying a reference memory cell corresponding to each memory state intermediate between multilevel data with a reference current from a reference loading circuit and converting the reference current flowing through the reference memory cell sequentially selected into a reference voltage. The reference voltage generator circuit modifies the current supply capability of the reference loading circuit corresponding to a change in the selection of the reference memory cell to suppress a change in the reference voltage derived from a change in the reference current and the read-out voltage generator circuit modifies the current supply capability of the main loading circuit corresponding to a change in the selection of the reference memory cell to increase or decrease in proportion to the current supply capability of the reference loading circuit.

12 Claims, 9 Drawing Sheets

READ-OUT CIRCUIT IN SEMICONDUCTOR MEMORY DEVICE

CROSS REFERENCE TO RELATED APPLICATION

This Nonprovisional application claims priority under 35 U.S.C. §119(a) on Patent Application No. 2005-212557 filed in Japan on Jul. 22, 2005, the entire contents of which are hereby incorporated by reference.

BACKGROUND OF THE INVENTION

1. Field of the Invention

The present invention relates to a read-out circuit in a semiconductor memory device for reading a multilevel data of three or more levels from selected memory cells in a memory cell array where a number of multilevel data storable memory cells are arranged in an array.

2. Description of the Related Art

A typical read-out circuit in a semiconductor memory device is provided for supplying a selected memory cell to be accessed for reading a data with electric current, comparing the (cell) current depending on the data to be read with a reference current to judge whether the cell current is greater or smaller than the reference current, and reading out the data from the selected memory cell in response to the result of the comparison. This technique for reading a data through judging the size of a cell current is called a current-sense method. It is known, for example, in a semiconductor memory device of two-level type where each memory holds one bit of data that two different memory states, where the cell current is great (i.e., the data is expressed by "1") and small (i.e., the data is expressed by "0"), are predetermined as shown in FIG. 7 and the reference current is set at the intermediate between the two cell currents for their respective memory states for use to read one bit of data. In common, the reference current may be produced with the use of a reference memory cell formed in the same way as each memory cell to be accessed. Alternatively, instead of direct comparison between the cell current and the reference current, another technique is known where the degree of the cell current is indirectly compared with the reference current, in which the cell and reference currents are first subjected to current-voltage conversion, respectively, and then compared with one another. Hereinafter, this technique is referred to as a voltage-sense method, for descriptive purposes, as opposed to the current-sense method.

For responding to the demand of increasing the storage size and minimizing the cost of the production, a variety of multilevel data storable semiconductor memory devices have been developed as mass-storage semiconductor chips for storing three or more levels (e.g., two bits) of data in each memory cell. For example, a four-level data storable semiconductor memory device is provided where two bits of data are stored in each memory cell. As shown in FIG. 3, the cell current is classified into four different states between which three different intermediates of the reference current are allocated thus to read the four two-bit data by comparing the cell current with the three intermediates. For storing n-bit data in each memory cell, such a type of the multilevel data storable semiconductor memory device employs $2^n$ different states of the cell current and $(2^n-1)$ states of the reference current.

It is common that the multilevel semiconductor memory device is narrower in the range of the current for identifying one level (memory state) than a two-level semiconductor memory device. There will hence be difficult for physically sparing a generous margin of difference between the cell current and the reference current. If the difference between the cell current and the reference current is too small, it may fail to permit a significant freedom of action in the read-out circuit. Also, there are two or more steps of comparing between the currents needed for reading out the data. These steps may be carried out in two different manners, a parallel-sense method where they are conducted in parallel and a time-division sense method where they are conducted in a sequence. An example of the parallel-sense method is disclosed in Japanese Patent Laid-Open Publication No. 2004-63018 (referred to as Citation 1 hereinafter). An example of the time-division sense method is disclosed in Japanese Patent Laid-Open Publication No. H10-501361 (referred to as Citation 2 hereinafter).

While the example of the parallel-sense method is substantially equal in the duration of time required for the comparison to a two-level data storable semiconductor memory device, it has to provide a number of sense circuits for the comparison which is identical to the number of the reference currents in each memory cell to be accessed. Accordingly, the read-out circuit will be enlarged in the installation area and disadvantageously increased in the production cost. For example, in the four-level data storable semiconductor memory device where a two-bit data is stored in each memory cell, twenty four of the sense circuits are needed for reading 16 bits of data because the number of memory cells to be accessed at the same time is eight and the reference current to be used has three different states. Considering the fact that the two-level data storable semiconductor memory device requires sixteen of the sense circuits, using the parallel-sense method increases the installation area of the read-out circuit of the four-level data storable semiconductor memory device in comparison with the two-level data storable semiconductor memory device.

On the other hand, the time-division sense method requires only one sense circuit for the comparison in each of memory cells to be accessed at the same time, thus minimizing the increase of the installation area of the read-out circuit. For example, in the four-level data storable semiconductor memory device where a two-bit data is stored in each memory cell, eight of the sense circuits are needed for reading 16 bits of data because the number of memory cells to be accessed at the same time is eight. Accordingly, the four-level data storable semiconductor memory device will hence be smaller in the installation area of the read-out circuit than the two-level data storable semiconductor memory device. Although being advantageous in the installation area of the read-out circuit, the time-division sense method causes an n-level data storable semiconductor memory device where n bits of data are stored in each memory cell to be subjected to the time division process for the comparison at least n times, thus lengthening the read-out action.

An example of the time-division sense method will now be explained briefly where a four-level data of two bits per cell is read out, referring to FIG. 8. FIG. 8 is a circuitry diagram schematically showing an arrangement of the read-out circuit in a conventional semiconductor memory device using the time-division sense method as well as the voltage-sense method. The memory cells shown in FIG. 8 are of a flash memory type having the floating gate structure.

As shown in FIG. 8, the read-out circuit 50 using the time-division sense method includes a current loading circuit 51 for feeding a voltage to the drain of a selected memory cell 57 to be accessed to produce a read-out current (cell current) depending on the memory state and another current loading circuit 52 for feeding a reference current to reference memory cells 58 to 60. The selected memory cell 57 is electrically connected at the drain to the current loading circuit 51 by a sense line 61. The current loading circuit 52 is electrically connected with a reference line 62. The current loading circuit 51 has a current-voltage conversion function along the sense line 61 for converting the cell current into a read-out voltage while the current loading circuit 52 has a current-voltage conversion function along the reference line 62 for converting the reference current into a reference voltage. The sense line 61 and the reference line 62 are connected to two differential input ports of a sense amplifier 53 respectively for amplifying and releasing a difference of the potentials between the sense line 61 and the reference line 62 (that is, a voltage difference between the read-out voltage and the reference voltage). The output port of the sense amplifier 53 is connected to a first data latch circuit 54 for latching the result of a first sensing action and a second data latch circuit 55 for latching the result of a second sensing action. The data latch circuits 54 and 55 temporarily retain the data released from the sense amplifier 53. When the data retained in the second data latch circuit 55 is defined, the first data latch circuit 54 and the second data latch circuit 55 release their respective latch output signals 63 and 64 for allowing a two-bit data to be read out from the selected memory cell 57. Also, during the sense action, the latch output signal 63 of the first data latch circuit 54 is delivered to a selector circuit 56 which in turn conducts a switching action to connect the reference line 62 to any of the three reference memory cells 58 to 60 which are different in the reference current.

In the case of using the time-division sensing method in the conventional multilevel data storable semiconductor memory device employing the voltage-sense method as described above, the I-V relationship between the reference voltage and the reference current in the four-level data storable semiconductor memory device where a two-bit data is stored in each memory cell will be described as an example, referring to FIG. 9. The I-V relationship between the reference voltage and the reference current represents a linear characteristic where the value of the reference current is varied in proportion to the reference voltage and a saturated characteristic where the value of the reference current remains not varied when the reference voltage changes for each of three intermediate reference currents L, M, and H designated between the four different levels of the data. It is also assumed that the reference memory cells assigned with the three reference currents L, M, and H are different in the current drive capability. Moreover, the I-V relationship between the reference voltage and the reference current shown in FIG. 9 is based on the fact that the load in the current loading circuit is a common resistance.

As apparent from FIG. 9, the values of the reference current and the reference voltage are determined for each of reference currents L, M, and H at the intersection (action) point of the I-V characteristic and the load characteristic of the current loading circuit respectively. The reference voltage for each of reference currents L, M, and H as shown in FIG. 9 corresponds to a supply voltage input from the reference line 62 to the sense amplifier 53 shown in FIG. 8, indicating the action point of the sense amplifier 53.

Generally speaking, the action point of the sense amplifier employing the voltage-sense method has a nonlinear characteristic, where the margin for the read-out action can be increased by increasing the rate of amplification of the voltage in a limited range about the action point. However, when the multilevel data storable semiconductor memory device employs the time-division sense method, its sense amplifier is provided for each memory cell and its reference voltages are different depending on their corresponding reference currents. This allows the action point of the sense amplifier to be varied with the reference current. It will hence be difficult to optimize the margin of action during the comparison between the reference voltage and the read-out voltage at each reference current. On the other hand, the parallel sense method which is disadvantageous in the installation of area includes the sense amplifier for each reference current and can thus optimize the action point of the sense amplifier separately.

SUMMARY OF THE INVENTION

The present invention has been developed in view of the foregoing aspects and its object is to provide a read-out circuit in a semiconductor memory device of a time-division sense method which ensures a large margin of the read-out action in a multilevel data storable semiconductor memory device while speeding up the read-out action.

For achievement of the object of the present invention, a read-out circuit in a semiconductor memory device is provided as a first feature for reading out multilevel data stored in a memory cell to be read that is selected from a memory cell array arranged with a plurality of memory cells capable of storing multilevel data with three or more levels, including: a read-out voltage generator circuit which converts a memory cell current flowing through the selected memory cell into a read-out voltage; a reference voltage generator circuit which sequentially selects one of reference memory cells each memory state of which is intermediately assigned between two adjacent data levels of the multilevel data ordered by the memory cell current and which converts a reference current flowing through the reference memory cell into a reference voltage; and a sense circuit which amplifies a change in the read-out voltage or a difference between the read-out voltage and the reference voltage for each selection of the reference memory cells. The reference voltage generator circuit includes a reference loading circuit that supplies the selected reference memory cell with the reference current, wherein the current supply capability of the reference loading circuit is selectively determined in response to a change in the selection of the reference memory cell so as to suppress the change in the reference voltage derived from a change in the reference current. Also, the read-out voltage generator circuit includes a main loading circuit that supplies the memory cell to be accessed with the memory cell current, wherein the current supply capability of the main loading circuit is selectively determined in response to a change in the selection of the reference memory cell so as to increase or decrease in proportion to the current supply capability of the reference loading circuit.

The read-out circuit provided as the first feature allows the read-voltage generator circuit to supply the selected memory cell with a current from the main loading circuit of which the current supply capability is modified to match the selected reference memory cell and convert the memory cell current produced depending on the memory state of the selected memory cell into a read-out voltage. On the other hand, the reference voltage generator circuit supplies the selected reference memory cell with a reference current from the reference loading circuit of which the current supply capability is modified to match the selected reference memory cell and convert the reference current into a reference voltage. The sense circuit then amplifies a change in the read-out voltage or a difference between the read-out voltage and the reference voltage and indirectly compares between the memory cell current and the reference current in order to identify one corresponding bit in the data of the memory state of the selected memory cell with reference to the reference current in the reference memory cell. As the reference memory cells are switched from one to another, all the bits in the data indicating the memory state of the selected memory cell can be identified. In particular, since the current supply capability of the reference loading circuit for supplying the reference memory cell with the reference current is modified to suppress any change in the reference voltage resulting from a change in the reference current, the variation of the reference voltage on the reference memory cell to be selectively converted can be contained in a narrower range than the case where the current supply capability of the reference loading circuit remains fixed. This permits any discrepancy of the action point in the sense circuit derived from the difference of the reference memory cells to stay in a limited range. Accordingly, the sense circuit can be operated at higher efficiency while remaining in its active range, hence increasing the margin of the action and ensuring the read-out action at higher speeds. Also, since the current supply capability of the main loading circuit is increased or decreased in proportion to the current supply capability of the reference loading circuit, the relationship in the loading condition between the memory cell current and the reference current can remain uniform regardless of the selection between the reference memory cells. As the result, the relationship in the intensity between the memory cell current and the reference current is always reflected correctly in the relationship in the magnitude between the read-out voltage and the reference voltage regardless of any change in the reference current due to the selection of the reference memory cell with the loading condition, thus ensuring the accuracy of the read-out action.

The read-out circuit in the semiconductor memory device of the first feature may be modified as a second feature in which the main loading circuit and the reference loading circuit are equal in the current supply capability under the same voltage condition at each of the selected reference memory cells.

The read-out circuit of the second feature allows the reference current in the reference memory cell to be designated as an intermediate current between different settings of the memory cell current assigned to the corresponding levels of the multilevel data. Accordingly, the current drive capability of each reference memory cell can be determined by the direct relationship in the intensity between the memory cell currents which represent the different data levels. Also, as the main loading circuit and the reference loading circuit are equal in the current supply capability, the read-out circuit can easily be designed to permit the effect of any change in the current supply capability due to variations of the manufacturing process, the source voltage, the operating temperature, and the other conditions equally between the main loading circuit and the reference loading circuit, hence minimizing the declination of the action margin caused by the variations.

The read-out circuit in the semiconductor memory device as any of the foregoing features may be modified as a third feature in which the reference voltage generator circuit is arranged to selectively modify the current supply capability of the reference loading circuit in response to a change in the selection of the reference memory cell so as to maintaining the reference voltage at a uniform level.

The read-out circuit of the third feature allows the current supply capability of the reference loading circuit for supplying the reference memory cell with a reference current to be selectively modified for suppressing any change in the reference voltage resulting from a change in the reference current and thus maintaining the reference voltage at a uniform level (but permitting a negligible change in the voltage). Accordingly, the variation of the reference voltage on the reference memory cell to be selectively converted can be contained in a narrower range than the case where the current supply capability of the reference loading circuit remains fixed. As the result, the sense circuit can effectively be controlled to contain the displacement of the action point due to a difference between the reference memory cells in a limited range, hence increasing the margin of the action and ensuring the read-out action at higher speeds.

The read-out circuit in the semiconductor memory device of any of the foregoing features may be modified as a fourth feature in which the main loading circuit acts as a current mirror circuit with the reference loading circuit for each selection of the reference memory cells.

The read-out circuit of the fourth feature allows the current supply capability of the main loading circuit to be increased or decreased in proportion to the current supply capability of the reference loading circuit in response to a change in the selection of the reference memory cell. Also, since the main loading circuit is operated for causing the reference loading circuit to produce a current at a desired ratio determined by the current mirror ratio to the reference current in the reference memory cell (e.g., the reference current when the current mirror ratio is 1:1), the read-out voltage can be varied so that the memory cell current in the memory cell to be accessed is equal to the current supplied by the main loading circuit. As the result, the current mirror circuit acts as a current sense amplifier for directly judging the intensity of the memory cell current or a pre-amplifier for the sense circuit, whereby the margin of the read-out action will be improved.

The read-out circuit in the semiconductor memory device of any of the first to third features may be modified as a fifth feature in which the main loading circuit and the reference loading circuit are connected to each other in such a manner that the current in the main loading circuit is varied depending on the reference voltage while the current in the reference loading circuit is varied depending on the read-out voltage for each selection of the reference memory cells.

The read-out circuit of the fifth feature allows the difference between the read-out voltage and the reference voltage to be greater than that when the main loading circuit and the reference loading circuit are not connected to each other. Accordingly, the main loading circuit and the reference loading circuit which are connected to each other can serve as a current sense amplifier for directly judging the relationship in the intensity between the memory cell currents or a pre-amplifier for the sense circuit, hence increasing the margin of the read-out action.

The read-out circuit in the semiconductor memory device of any of the foregoing features may be modified as a sixth feature in which each of the main loading circuit and the reference loading circuit includes a current supply paths each of which has a different current supply capability and can be selectively determined by on and off controlling actions for each selection of the reference memory cells.

The read-out circuit in the semiconductor memory device of any of the first to fifth features may be modified as a seventh feature in which each of the main loading circuit and the reference loading circuit includes a plurality of current supply paths which can be controlled by on and off action so that the current supply capability can be desirably modified through selectively determining a combination of the current supply paths by on and off controlling actions for each selection of the reference memory cells.

The read-out circuit in the semiconductor memory device of the sixth or seventh feature may be modified as an eighth feature in which each of the current supply paths comprises a MOSFET for the on and off controlling action and a MOSFET for modifying the current supply capability and these MOSFETs are connected in series.

The read-out circuit of any of the sixth to eighth features allows the main loading circuit and the reference loading circuit to be modified in the current supply capability corresponding to the selected reference memory cell to produce a change in the reference current.

The read-out circuit in the semiconductor memory device of any of the sixth to eighth features may be modified as a ninth feature in which the number of the current supply paths or their combination in each of the main loading circuit and the reference loading circuit is equal to or greater than the selectable number of the reference memory cells.

The read-out circuit of the ninth feature allows the current supply capability of each of the main loading circuit and the reference loading circuit to be modified at a wider range of freedom, hence improving the accuracy of the adjustment on each current supply capability and thus increasing the margin of the read-out action.

The read-out circuit in the semiconductor memory device of any of the foregoing features may further be modified as a tenth feature in which the reference memory cell to be selected next is determined in response to the output level of the sense circuit for the selected reference memory cell.

The read-out circuit of the tenth feature allows the selection between the reference memory cells to be minimized in the number of its action thus decreasing the overall length of time required for carrying out the read-out action. For example, when the semiconductor memory device is of 16-level data storable type, 16 levels of the memory state can be specified by conducting the selecting action four times from fifteen of the reference memory cells.

DETAILED DESCRIPTION OF THE INVENTION

A read-out circuit in a semiconductor memory device according to the present invention (referred to as an inventive circuit hereinafter) will be described in more detail referring to the relevant drawings. Although this embodiment involves a read-out action on a nonvolatile semiconductor memory device including flash memories of a floating gate arrangement, its inventive circuit is applicable commonly to a multilevel data storable semiconductor memory device where the read-out action is conducted using a time-division sense method but not limited to the nonvolatile semiconductor memory device. Also, since the following description resides in only a part of the read-out action, it will not cover other components including a write-in circuit, an erase circuit, and a control circuit which are not related to the present invention.

First Embodiment

Figure 1:
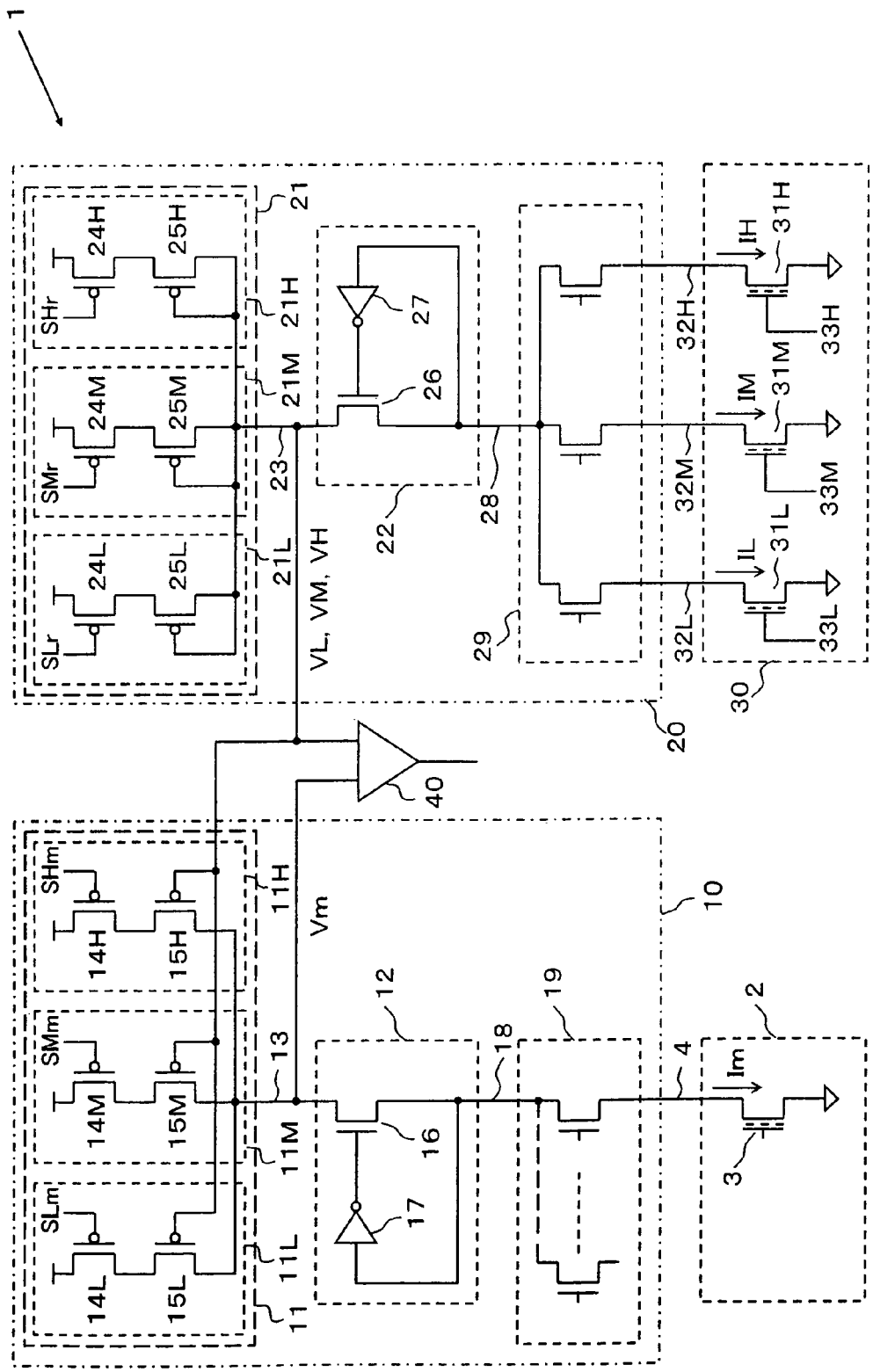
FIG. 1 is a circuitry diagram showing the first embodiment of a read-out circuit in a semiconductor memory device according to the present invention.

FIG. 1 is a circuitry diagram of the inventive circuit 1. As shown in FIG. 1, the inventive circuit 1 is a read-out circuit for reading a multilevel data from a selected memory cell 3 in a memory cell array 2 which has multilevel, three or more levels, data storable memory cells arranged in an array, which comprises a read-out voltage generator circuit 10, a reference voltage generator circuit 20, a reference memory cell array 30, and a sense circuit 40. It should be noted that the multilevel data storable memory cells in this embodiment is of a four-level data storable type for ease of the description.

Figure 2:
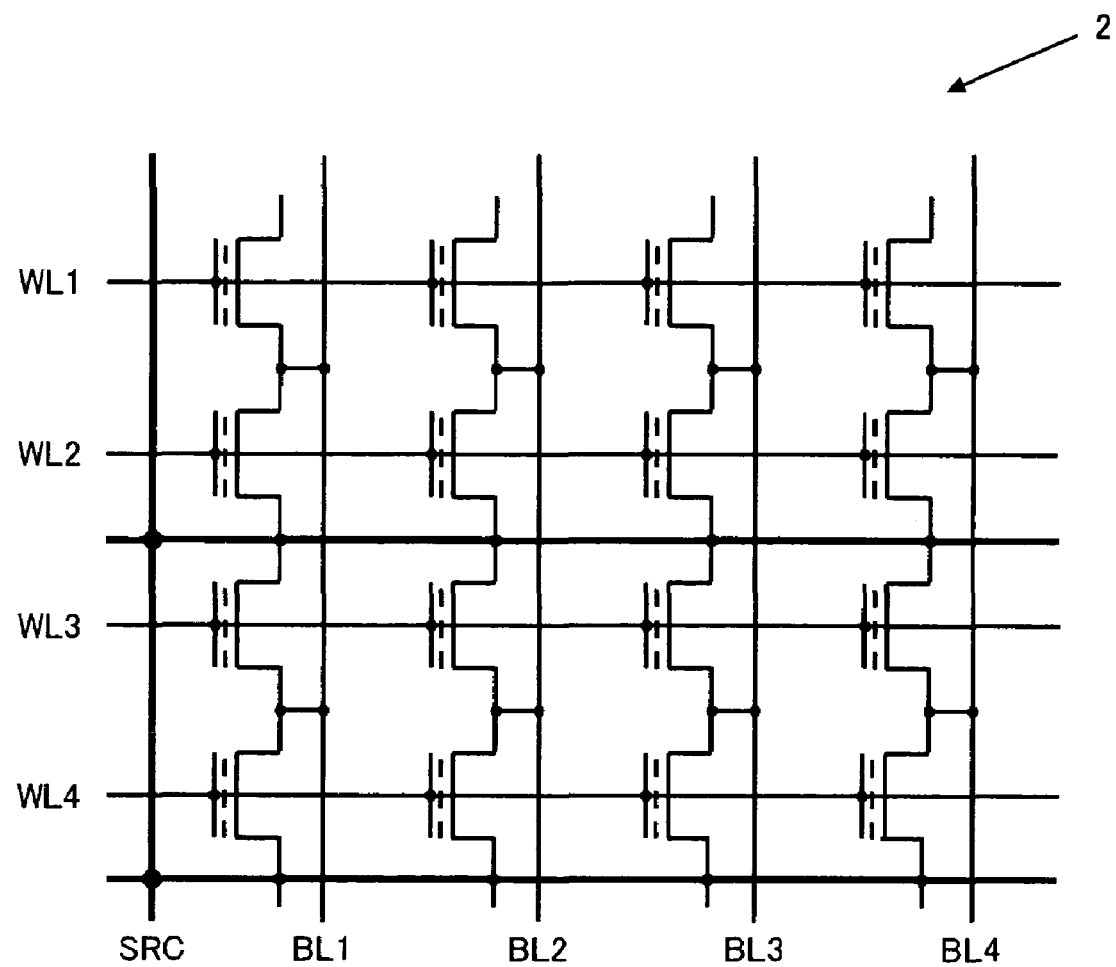
FIG. 2 is a circuitry diagram showing a schematic arrangement of a memory cell array where a desired data is read using the read-out circuit in a semiconductor memory device according to the present invention.

The memory cell array 2 has memory cells arranged in a matrix consisting of rows and columns, as shown in FIG. 2. The drains of the memory cells along each column are connected to common bit lines BL1 to BL4 which extend along the columns while the gates of the memory cells along each row are connected to common word lines WL1 to WL4 which extend along the rows. The sources are connected to a common source line SRC L in each block of the memory cells. While the memory cells shown in FIG. 2 are connected in a block matrix consisting of four rows by four columns for ease of the description, they may arbitrarily be arranged in a desired number of rows and columns. The bit lines BL1 to BL4 are connected to a column selector circuit 19 shown in FIG. 1. The column selector circuit 19 is provided for selecting a bit line 4, which is connected to a selected memory cell 3 to be accessed, from a number of the bit lines and connecting it to the read-out voltage generator circuit 10, as shown in FIG. 1. The column selector circuit 19 may be an n-channel MOSFET (referred to as an NMOS hereinafter) which is connected at the gate with a column select signal which has been produced by decoding the address signal.

The read-out voltage generator circuit 10 is a current/voltage converter circuit for converting the memory cell current Im depending on the memory state of the selected memory cell 3 into a read-out voltage Vm, which comprises a main loading circuit 11 and a bit-line voltage adjusting circuit 12. The main loading circuit 11 is a current supply circuit for supplying the selected memory cell 3 with the memory cell current Im via a main sense line 13, the bit-line voltage adjusting circuit 12, a second bit line 18, the column selector circuit 19, and the bit line 4. In this embodiment, the main loading circuit 11 has three current supply paths 11L, 11M, and 11H connected in parallel. The letters L, M, and H are commonly used for denoting the components and circuits selected corresponding to the three reference memory cells 31L, 31M, and 31H.

The three current supply paths 11L, 11M, and 11H are connected at one end to a voltage source and at the other to the bit-line voltage adjusting circuit 12 via the main sense line 13. The main sense line 13 is supplied with the read-out voltage Vm. Each of the current supply paths 11L, 11M, and 11H may be a series connected circuit of two p-channel MOSFETs (referred to as PMOSs hereinafter). The PMOSs 14L, 14M, and 14H at the voltage source side act as switching elements for selectively conducting the current supply paths 11L, 11M, and 11H corresponding to the state of the reference memory cells 31L, 31M, and 31H and are connected at the gate with three select control signals SLm, SMm, and SHm respectively. The PMOSs 15L, 15M, and 15H at the main sense line 13 side are MOSFETs for adjusting the current supply capability to selectively determine the current supply of the main loading circuit 11 with the select control signals SLm, SMm, and SHm respectively, where their transistor size (the gate width) are modified for being different in the current supply capability.

The bit-line voltage adjusting circuit 12 includes an NMOS 16 and an inverter 17 for maintaining the voltage at the bit line 33 connected to the selected memory cell 3 in the memory cell array 2 at substantially a uniform level thus to make the drain voltage received by the selected memory cell 3 uniform regardless of the memory state of the selected memory cell 3 and reveal a change in the memory cell current Im depending on the memory state (a change in the threshold voltage). The NMOS 16 is connected at the drain to the main sense line 13, at the source to the second bit line 18, and at the gate to the output of the inverter 17. The input of the inverter 17 is connected to the second bit line 18. When the voltage at the second bit line 18 is declined to lower than the inversion level of the inverter 17, the output of the inverter 17 shifts to the high level thus turning the NMOS 16 on. This allows the current to be transferred from the main loading circuit 11 to the second bit line 18, thus returning back the voltage to its high level. Alternatively, when the voltage at the second bit line 18 is increased to higher than the inversion level of the inverter 17, the output of the inverter 17 shifts to the low level thus turning the NMOS 16 off. This allows the current from the main loading circuit 11 to the second bit line 18 to be canceled, thus returning back the voltage to its low level across the selected memory cell 3. Accordingly, the voltage at the second bit line 18 can automatically be adjusted to remain close to the inversion level of the inverter 17 before transferred to the bit line 4.

The reference voltage generator circuit 20 is another current/voltage converter circuit for converting the any selected one of the reference currents IL, IM, and IH assigned to the reference memory cells 31L, 31M, and 31H respectively into a reference voltage VL, VM, or VH, which comprises a reference loading circuit 21 and a reference bit-line voltage adjusting circuit 22. The reference loading circuit 21 is a current supply circuit for supplying the selected one of the reference memory cells 31L, 31M, and 31H with the reference current IL, IM, or IH via a reference sense line 23, the reference bit-line voltage adjusting circuit 22, a second reference bit line 28, a reference memory cell selector circuit 29, and selected one of the reference bit lines 32L, 32M, and 32H. In this embodiment, the reference loading circuit 21 has three current supply paths 21L, 21M, and 21H connected in parallel.

The three current supply paths 21L, 21M, and 21H are connected at one end to the voltage source and at the other to the reference bit-line voltage adjusting circuit 22 via the reference sense line 23. The reference sense line 23 is supplied with one of the reference voltages VL, VM, and VH. Each of the current supply paths 21L, 21M, and 21H may be a series connected circuit of two PMOSs. The PMOSs 24L, 24M, and 24H at the voltage source side act as switching elements for selectively conducting the current supply paths 21L, 21M, and 21H corresponding to the state of the reference memory cells 31L, 31M, and 31H and are connected at the gate with three select control signals SLr, SMr, and SHr respectively. The PMOSs 25L, 25M, and 25H at the reference sense line 23 side are MOSFETs for adjusting the current supply capability to selectively determine the current supply of the reference loading circuit 21 with the select control signals SLr, SMr, and SHr respectively, where their transistor size (the gate width) are modified for being different in the current supply capability.

The read-out voltage generator circuit 10 and the reference voltage generator circuit 20 are identical in the circuitry arrangement to each other, except that the reference sense line 23 is connected to a group of the PMOSs 15L, 15M, and 15H in the main loading circuit 11 and a group of the PMOSs 25L, 25M, and 25H in the reference loading circuit 21 at the respective gates to form a current mirror circuit configuration. In this respect, the PMOSs 15L, 15M, and 15H are arranged equal in the transistor size (the gate width) to the corresponding PMOSs 25L, 25M, and 25H so that the three current supply paths 11L, 11M, and 11H in the main loading circuit 11 are equal in the current supply capability to the three current supply paths 21L, 21M, and 21H in the reference loading circuit 21 under the same conditions for voltage application. As will be explained later in more detail, the PMOSs 15L, 15M, and 15H in the main loading circuit 11 are different in the current supply capability while the PMOSs 25L, 25M, and 25H in the reference loading circuit 21 are different in the current supply capability. Accordingly, in response to the selection from the reference memory cells 31L, 31M, and 31H, the main loading circuit 11 and the reference loading circuit 21 can selectively conduct the current supply paths 11L, 11M, and 11H and the current supply paths 21L, 21M, and 21H which are equal in the current supply capability corresponding to the selection of the reference memory cell.

The reference bit-line voltage adjusting circuit 22 includes an NMOS 26 and an inverter 27 for maintaining the voltage at one of the reference bit lines 32L, 32M, and 32H connected to the selected reference memory cell 31L, 31M, or 31H in the reference memory cell array 30 at substantially a uniform level thus to make the drain voltage received by the selected reference memory cell 31L, 31M, or 31H uniform regardless of the memory state of the reference selected memory cell and reveal a change in the reference memory cell current IL, IM, or IH depending on the memory state (a change in the threshold voltage). The NMOS 26 is connected at the drain to the reference sense line 23, at the source to the second reference bit line 28, and at the gate to the output of the inverter 27. The input of the inverter 27 is connected to the second reference bit line 28. When the voltage at the second reference bit line 28 is declined to lower than the inversion level of the inverter 27, the output of the inverter 27 shifts to the high level thus turning the NMOS 26 on. This allows the current to be transferred from the reference loading circuit 21 to the second reference bit line 28, thus returning back the voltage to its high level. Alternatively, when the voltage at the second reference bit line 28 is increased to higher than the inversion level of the inverter 27, the output of the inverter 27 shifts to the low level thus turning the NMOS 26 off. This allows the current from the reference loading circuit 21 to the second reference bit line 28 to be canceled, thus returning back the voltage to its low level across the selected reference memory cell 31L, 31M, or 31H. Accordingly, the voltage at the second reference bit line 28 can automatically be adjusted to remain close to the inversion level of the inverter 27 before transferred to the reference bit line 32L, 32M, or 32H. Specifically when the inverter 27 in the reference bit-line voltage adjusting circuit 22 is set equal in the inversion level to the inverter 17 in the bit-line voltage adjusting circuit 12, the selected on of the reference memory cells 31L, 31M, and 31H can match the selected memory cell 3 in the conditions for voltage application.

The reference memory array 30 is composed of the three reference memory cells 31L, 31M, and 31H which deliver their respective different reference currents IL, IM, and IH in the same condition for voltage application. The reference memory cells 31L, 31M, and 31H are connected at the drain to the corresponding reference bit lines 32L, 32M, and 32H, at the gate to the corresponding reference word lines 33L, 33M, and 33H, and at the source to a common source line (grounded in the drawing). The reference bit lines 32L, 32M, and 32H are connected to the common second reference bit line 28 via the reference memory cell selector circuit 29 which includes NMOSs. For selecting one from the reference memory cells 31L, 31M, and 31H, its corresponding reference word line 33L, 33M, or 33H can be shifted to the high level. Alternatively, the NMOS connected to selected one of the reference memory cells 31L, 31M, and 31H in the reference memory cell selector circuit 29 can be turned to the on state.

Figure 3:
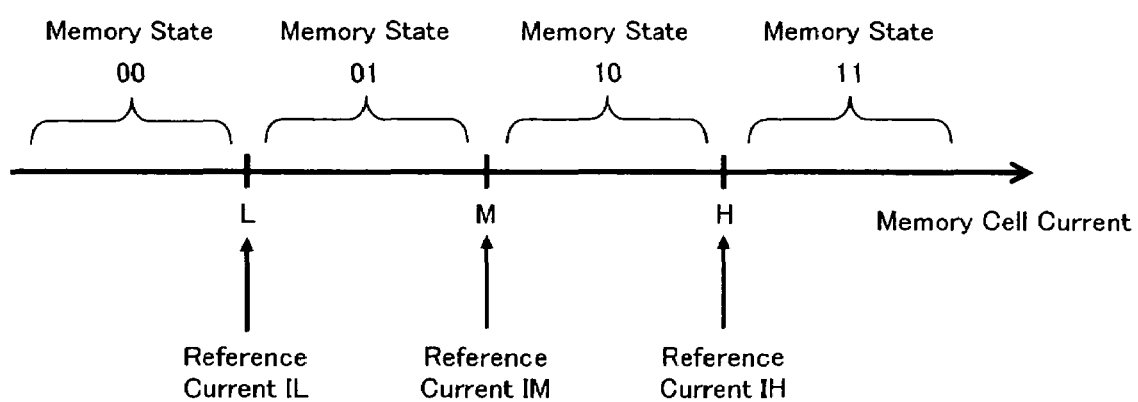
FIG. 3 illustrates an example of the relationship between the memory cell current and the memory state of four-level data in a four-level data storable semiconductor memory device.

The relationship in the memory state between the selected memory cell and the reference memory cells 31L, 31M, and 31H will now be explained. The memory state of the selected memory cell in this embodiment is one of the four levels, 00, 01, 10, and 11. The memory cell current Im is hence designated to one of the four different current ranges under given conditions for voltage application, as shown in FIG. 3, depending on the difference in the threshold voltage which is determined by the charge to the floating gate of the memory cell. It is assumed that the reference currents IL, IM, and IH to be supplied to the three reference memory cells 31L, 31M, and 31H in the same condition for voltage application respectively are assigned to the three intermediate currents between the two memory states 00 and 01, between the two memory states 01 and 10, and between the two memory states 10 and 11 respectively. In other words, the three reference memory cells 31L, 31M, and 31H represent three different intermediate states between any two adjacent data levels of four level data (among 00, 01, 10, and 11) which are ordered by the memory cell current Im.

Accordingly, when the memory cell current Im running through the selected memory cell is smaller than the reference current IM, the upper bit in the memory state can be judged as 0. When the memory cell current Im is greater than the reference current IM, the upper bit in the memory state can be judged as 1. While the upper bit in the memory state remains at 0, the lower bit in the memory state can be judged as 0 when the memory cell current Im is smaller than the reference current level IL. Alternatively, when the memory cell current Im is greater than the reference current IL, the lower bit in the memory state can be judged as 1. Similarly, when the memory cell current Im is smaller than the reference current IH with the upper bit in the memory state remaining at 1, the lower bit in the memory state can be judged as 0. Alternatively, when the memory cell current Im is greater than the reference current IH, the lower bit in the memory state can be judged as 1.

The sense circuit 40 is a common differential amplifier circuit for amplifying a difference of the voltage between two input signals received at its two input ports to compare the magnitude between the two input signals and is connected at one of the two input ports with the main sense line 13 of the read-out voltage generator circuit 10 and at the other input port with the reference sense line 23 of the reference voltage generator circuit 20. In the sense circuit 40, a difference between the read-out voltage Vm for the selected memory cell 3 and one of the reference voltages VL, VM, and VH for their respective reference memory cells 31L, 31M, and 31H is amplified to examine whether the read-out voltage Vm is greater or smaller than the reference voltage VL, VM, or VH.

The relationship between the read-out voltage Vm and the three reference voltages VL, VM, and VH will be described. The relationship between the reference voltages VL, VM, and VH will be explained.

When the reference memory cell 31L is selected in the reference memory cell array 30, its corresponding current supply path 21L in the reference loading circuit 21 of the reference voltage generator circuit 20 becomes conducted while the other two current supply paths 21M and 21H remain not conducted. This establishes a current passage extending from the current supply path 21L via the reference sense line 23, the reference bit-line voltage adjusting circuit 22, the second reference bit line 28, the reference memory cell selector circuit 29, and the reference bit line 32L to the reference memory cell 31L. This allows the reference current IL, under the particular conditions for voltage application determined by the reference bit-line voltage adjusting circuit 22, to be transferred from the current supply path 21L via the current passage to the reference memory cell 31L. Since the PMOS 25L of the current supply path 21L is activated at the saturation range upon being short-circuited between the drain and the gate and its drain current is determined depending on the voltage between the drain and the source, the reference voltage VL across the reference sense line 23 is determined by the balance between the reference current IL and the current supply capability of the current supply path 21L. When the current supply capability is greater than the reference current IL, the reference voltage VL shifts to the high level. When the current supply capability is smaller than the reference current IL, the reference voltage VL shifts to the low level.

When the reference memory cell 31M is selected in the reference memory cell array 30, its corresponding current supply path 21M in the reference loading circuit 21 of the reference voltage generator circuit 20 becomes conducted while the other two current supply paths 21L and 21H remain not conducted. This establishes a current passage extending from the current supply path 21M via the reference sense line 23, the reference bit-line voltage adjusting circuit 22, the second reference bit line 28, the reference memory cell selector circuit 29, and the reference bit line 32M to the reference memory cell 31M. This allows the reference current IM, under the particular conditions for voltage application determined by the reference bit-line voltage adjusting circuit 22, to be transferred from the current supply path 21M via the current passage to the reference memory cell 31M. Since the PMOS 25M of the current supply path 21M is activated at the saturation range upon being short-circuited between the drain and the gate and its drain current is determined depending on the voltage between the drain and the source, the reference voltage VM across the reference sense line 23 is determined by the balance between the reference current IM and the current supply capability of the current supply path 21M. When the current supply capability is greater than the reference current IM, the reference voltage VM shifts to the high level. When the current supply capability is smaller than the reference current IM, the reference voltage VM shifts to the low level. As the reference current IM is greater than the reference current IL, the reference voltage VM can be adjusted substantially equal to the reference voltage VL by setting the current supply capability of the current supply path 21M to a level greater than that of the current supply path 21L.

Similarly, when the reference memory cell 31H is selected in the reference memory cell array 30, its corresponding current supply path 21H in the reference loading circuit 21 of the reference voltage generator circuit 20 becomes conducted while the other two current supply paths 21L and 21M remain not conducted. This establishes a current passage extending from the current supply path 21H via the reference sense line 23, the reference bit-line voltage adjusting circuit 22, the second reference bit line 28, the reference memory cell selector circuit 29, and the reference bit line 32H to the reference memory cell 31H. This allows the reference current IH, under the particular conditions for voltage application determined by the reference bit-line voltage adjusting circuit 22, to be transferred from the current supply path 21H via the current passage to the reference memory cell 31H. Since the PMOS 25H of the current supply path 21H is activated at the saturation range upon being short-circuited between the drain and the gate and its drain current is determined depending on the voltage between the drain and the source, the reference voltage VH across the reference sense line 23 is determined by the balance between the reference current IH and the current supply capability of the current supply path 21H. When the current supply capability is greater than the reference current IH, the reference voltage VH shifts to the high level. When the current supply capability is smaller than the reference current IH, the reference voltage VH shifts to the low level. As the reference current IH is greater than the reference current VM, the reference voltage VH can be adjusted substantially equal to the reference voltages VL and VM by setting the current supply capability of the current supply path 21H to a level greater than that of the current supply path 21M.

Figure 4:
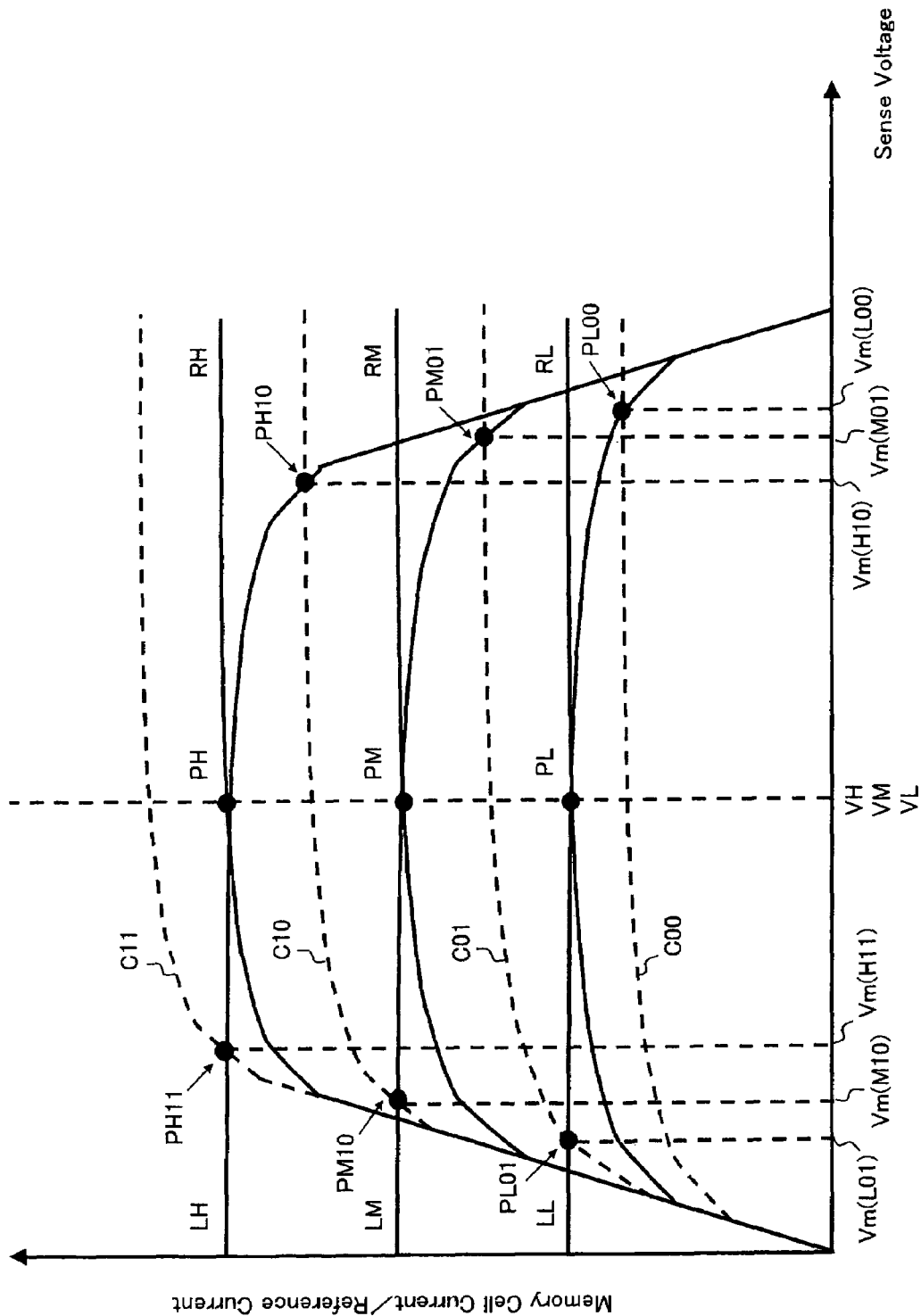
FIG. 4 is an I-V profile showing the characteristics of the action of the read-out circuit in a semiconductor memory device according to the present invention.

As the result, the three different reference voltages VL, VM, and VH can be set to an equal level precisely or substantially when the settings of the current supply capability of the current supply paths 21L, 21M, and 21H in the reference loading circuit 21 are determined by their respective reference currents IL, IM, and IH. FIG. 4 illustrates I-V profiles RL, RM, and RH of their respective reference currents IL, IM, and IH across the corresponding reference memory cells 31L, 31M, and 31H and loading characteristic profiles LL, LM, and LH of their respective current supply paths 21L, 21M, and 21H in the reference loading circuit 21. As shown in FIG. 4, the reference voltage VL is determined at the intersection point PL between the I-V profile RL of the reference current IL and the loading characteristic profile LL of the current supply path 21L, the reference voltage VM is determined at the intersection point PM between the I-V profile RM of the reference current IM and the loading characteristic profile LM of the current supply path 21M, and the reference voltage VH is determined at the intersection point PH between the I-V profile RH of the reference current IH and the loading characteristic profile LH of the current supply path 21H. As apparent from FIG. 4, the three different reference voltages VL, VM, and VH can be set to an equal level precisely or substantially when the settings of the current supply capability at the saturated range of the current supply paths 21L, 21M, and 21H are determined by their respective reference currents IL, IM, and IH.

The relationship between the read-out voltage Vm and the reference voltages VL, VM, and VH will be explained. When the reference memory cell 31L is selected in the reference memory cell array 30, its corresponding current supply path 21L in the reference loading circuit 21 of the reference voltage generator circuit 20 becomes conducted and simultaneously its corresponding current supply path 11L in the main loading circuit 11 of the read-out voltage generator circuit 10 becomes conducted. The other two current supply paths 11M and 11H remain not conducted. This establishes a current passage extending from the current supply path 11L via the sense line 13, the bit-line voltage adjusting circuit 12, the second bit line 18, the column selector circuit 19, and the bit line 4 to the selected memory cell 3. This allows the memory cell current Im, under the particular conditions for voltage application determined by the bit-line voltage adjusting circuit 12, to be transferred from the current supply path 11L via the current passage to the selected memory cell 3. Since the PMOS 15L of the current supply path 11L is connected at the drain to the sense line 13 and at the gate to the reference sense line 23 in the reference voltage generator circuit 20, it acts as a current mirror circuit of the PMOSs 25L of the current supply path 21L in the reference loading circuit 21 and selected in synchronism with the PMOS 15L of the current supply path 11L. Accordingly, when the memory cell current Im remains equal to the reference current IL, the read-out voltage Vm across the sense line 13 is equal to the reference voltage VL across the reference sense line 23. When the memory cell current Im is smaller than the reference current IL, the voltage between the drain and the source of the PMOS 15L of the current supply path 11L is declined for lowering the reference current IL to the level of the memory cell current Im in order to control the current supply capability of the current supply path 11L. As a result, the read-out voltage Vm across the sense line 13 is increased to a level higher than the reference voltage VL across the reference sense line 23. When the memory cell current Im is greater than the reference current IL, the drain voltage of the NMOS 16 in the bit-line voltage adjusting circuit 12 is declined for lowering the memory cell current Im received by the selected memory cell 3 to the level of the reference current IL in order to control the current supply capability of the bit-line voltage adjusting circuit 12, because PMOS 15L of the current supply path 11L has reached the saturated state with the read-out voltage Vm across the sense line 13 equal to the reference voltage VL and it is difficult to increase the current supply of the current supply path 11L to a level grater than the reference current IL. As a result the read-out voltage Vm across the sense line 13 is decreased to a level lower than the reference voltage VL across the reference sense line 23.

When the reference memory cell 31M is selected in the reference memory cell array 30, its corresponding current supply path 21M in the reference loading circuit 21 of the reference voltage generator circuit 20 becomes conducted and simultaneously its corresponding current supply path 11M in the main loading circuit 11 of the read-out voltage generator circuit 10 becomes conducted. The other two current supply paths 11L and 11H remain not conducted. This establishes a current passage extending from the current supply path 11M via the sense line 13, the bit-line voltage adjusting circuit 12, the second bit line 18, the column selector circuit 19, and the bit line 4 to the selected memory cell 3. This allows the memory cell current Im, under the particular conditions for voltage application determined by the bit-line voltage adjusting circuit 12, to be transferred from the current supply path 11M via the current passage to the selected memory cell 3. Since the PMOS 15M of the current supply path 11M is connected at the drain to the sense line 13 and at the gate to the reference sense line 23 in the reference voltage generator circuit 20, it acts as a current mirror circuit of the PMOSs 25M of the current supply path 21M in the reference loading circuit 21 and selected in synchronism with the PMOS 15M of the current supply path 11M. Accordingly, when the memory cell current Im remains equal to the reference current IM, the read-out voltage Vm across the sense line 13 is equal to the reference voltage VM across the reference sense line 23, as in the case where the reference memory cell 31L is selected. When the memory cell current Im is smaller than the reference current IM, the read-out voltage Vm rises up to a level higher than the reference voltage VM. When the memory cell current Im is greater than the reference current IM, the read-out voltage Vm drops down to a level lower than the reference voltage VM.

Similarly, when the reference memory cell 31H is selected in the reference memory cell array 30, its corresponding current supply path 21H in the reference loading circuit 21 of the reference voltage generator circuit 20 becomes conducted and simultaneously its corresponding current supply path 11H in the main loading circuit 11 of the read-out voltage generator circuit 10 becomes conducted. The other two current supply paths 11L and 11M remain not conducted. This establishes a current passage extending from the current supply path 11H via the sense line 13, the bit-line voltage adjusting circuit 12, the second bit line 18, the column selector circuit 19, and the bit line 4 to the selected memory cell 3. This allows the memory cell current Im, under the particular conditions for voltage application determined by the bit-line voltage adjusting circuit 12, to be transferred from the current supply path 11M via the current passage to the selected memory cell 3. Since the PMOS 15H of the current supply path 11H is connected at the drain to the sense line 13 and at the gate to the reference sense line 23 in the reference voltage generator circuit 20, it acts as a current mirror circuit of the PMOSs 25H of the current supply path 21H in the reference loading circuit 21 and selected in synchronism with the PMOS 15H of the current supply path 11H. Accordingly, when the memory cell current Im remains equal to the reference current IH, the read-out voltage Vm across the sense line 13 is equal to the reference voltage VH across the reference sense line 23, as in the case where the reference memory cells 31L and 4M are selected. When the memory cell current Im is smaller than the reference current IH, the read-out voltage Vm rises up to a level higher than the reference voltage VH. When the memory cell current Im is greater than the reference current IH, the read-out voltage Vm drops down to a level lower than the reference voltage VH.

In brief, as one of the reference memory cells 31L, 31M, and 31H has been selected by the action of the read-out voltage generator circuit 10 and the reference voltage generator circuit 20, its corresponding reference current IL, IM, or IH is compared directly with the memory cell current Im at the current path developed in the read-out voltage generator circuit 10. This will implement a current sense circuit which outputs the above-mentioned comparison result depending on whether the read-out voltage Vm across the sense line 13 is smaller or greater than the reference voltage VL, VM, or VH.

Also shown in FIG. 4 are an I-V profile C00 of the memory cell current Im of the selected memory cell 3 at the memory state of 00, an I-V profile C01 of the memory cell current Im at the memory state of 01, an I-V profile C10 of the memory cell current Im at the memory state of 10, and an I-V profile C11 of the memory cell current Im at the memory state of 11. As the current supply paths 11L, 11M, and 11H in the main loading circuit 11 are identical in the loading characteristics to the current supply paths 21L, 21M, and 21H in the reference loading circuit 21, the voltage at the intersection point PL00 between the loading characteristic curve LL and the I-V profile C00 represents the read-out voltage Vm (L00) at the memory state of 00 with the reference memory cell 31L having being selected while the voltage at the intersection point PL01 between the loading characteristic curve LL and the I-V profile C01 represents the read-out voltage Vm (L01) at the memory state of 01 with the reference memory cell 31L having being selected. Equally, the voltage at the intersection point PM01 between the loading characteristic curve LM and the I-V profile C01 represents the read-out voltage Vm (M01) at the memory state of 01 with the reference memory cell 31M having being selected while the voltage at the intersection point PM10 between the loading characteristic curve LM and the I-V profile C10 represents the read-out voltage Vm (M10) at the memory state of 10 with the reference memory cell 31M having being selected. Furthermore, the voltage at the intersection point PH10 between the loading characteristic curve LH and the I-V profile C10 represents the read-out voltage Vm (H10) at the memory state of 10 with the reference memory cell 31H having being selected while the voltage at the intersection point PH11 between the loading characteristic curve LH and the I-V profile C11 represents the read-out voltage Vm (H11) at the memory state of 11 with the reference memory cell 31H having being selected.

As apparent from FIG. 4, the reference voltages VL, VM, and VH remain unchanged regardless of the selection between the reference memory cells 31L, 31M, and 31H when the selected memory cell 3 is uniform at the memory state. However, the relationship between the read-out voltage Vm and one of the reference voltages VL, VM, and VH is varied as the current supply paths 11L, 11M, and 11H in the main loading circuit 11 and the current supply paths 21L, 21M, and 21H in the reference loading circuit 21 change equally in the loading characteristics. Accordingly, the memory state of the selected memory cell 3 can be identified by examining the above-mentioned relationship through switching the reference memory cells 31L, 31M, and 31H.

In this embodiment, since the reference voltages VL, VM, and VH remain equal precisely or substantially through proper adjustment, the sense circuit 40 for amplifying the difference between the read-out voltage Vm and one of the reference voltages VL, VM, and VH can be activated in the same action range regardless of the selection between the reference memory cells 31L, 31M, and 31H. This will prevent the sense circuit 40 from declining in the margin or the speed of the action when any of the reference memory cells 31L, 31M, and 31H is selected.

Figure 5:
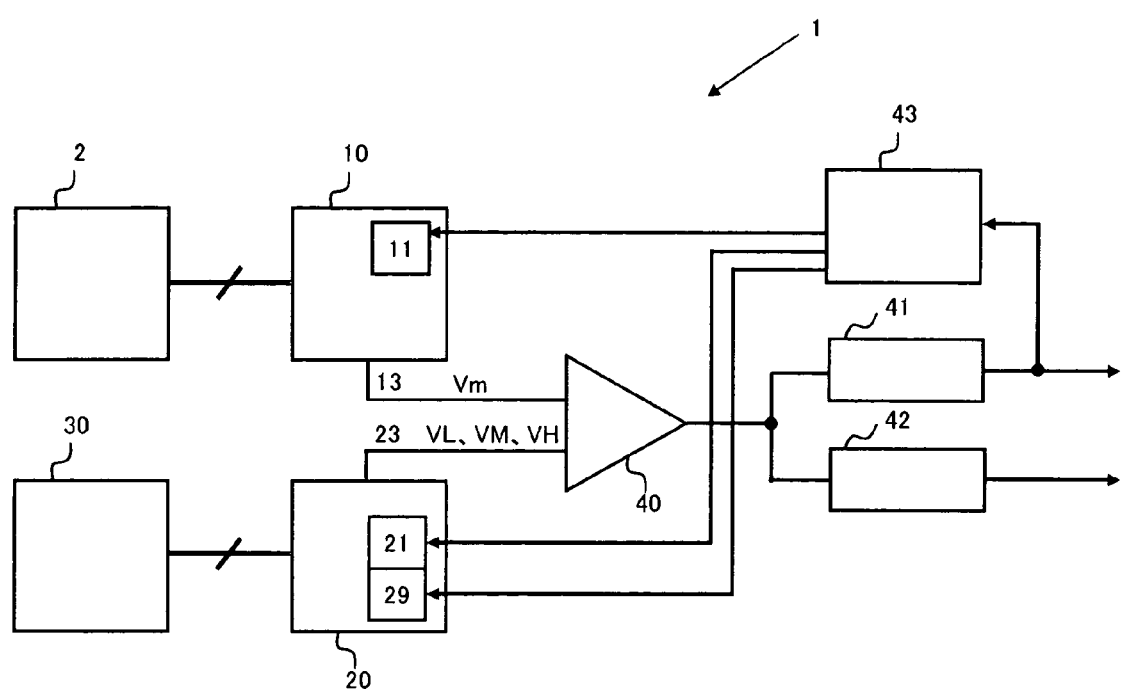
FIG. 5 is a block diagram schematically showing the first embodiment of a read-out circuit in a semiconductor memory device according to the present invention.

The controlling action of the inventive circuit 1 will significantly be described in steps. The inventive circuit 1 includes, as shown in FIG. 5, two, first and second, data latch circuits 41 and 42 connected to the sense circuit 40 and a reference memory cell selection control circuit 43. The reference memory cell selection control circuit 43 is provided for controllably selecting one of the reference memory cells 31L, 31M, and 31H at the second time in response to a sense output of the sense circuit 40 produced at the sense action at the first time and temporarily saved in the first data latch circuit 41. Also, as being synchronized with the selection from the reference memory cells 31L, 31M, and 31H, the current supply paths are selected from the current supply paths 11L, 11M, and 11H in the main loading circuit 11 and the current supply paths 21L, 21M, and 21H in the reference loading circuit 21.

When the reference memory cell 31M has been selected in the sense action at the first time, the current supply path 11M and the current supply path 21M are selectively conducted in the main loading circuit 11 and the reference loading circuit 21 respectively. This allows the read-out voltage Vm corresponding to the memory state to be supplied to the main sense line 13 in the read-out voltage generator circuit 10 and the reference voltage VM to be supplied to the reference sense line 23 in the reference voltage generator circuit 20. When the memory state is at 00 or 01, the I-V profile of the memory cell current Im extends lower than the I-V profile RM of the reference current IM as shown in FIG. 4 and its intersection point at the loading characteristic curve LM stays at the right side of the intersection PM between the loading characteristic curve LM and the I-V profile RM. As the result, the read-out voltage Vm determined by the voltage at the intersection point is higher than the reference voltage VM. When the memory state is at 10 or 11, the I-V profile of the memory cell current Im extends higher than the I-V profile RM of the reference current IM and its intersection point at the loading characteristic curve LM stays at the left side of the intersection PM between the loading characteristic curve LM and the I-V profile RM. As the result, the read-out voltage Vm determined by the voltage at the intersection point is lower than the reference voltage VM. It is hence judged that when the read-out voltage Vm is higher than the reference voltage VM, the upper bit of the memory state is 0 or when the read-out voltage Vm is lower than the reference voltage VM, the upper bit of the memory state is 1. The result of the judgment from the sense action at the first time is then temporarily saved in the first data latch circuit 41 as the sense output of the sense circuit 40.

At the second time of the sense action, the selection of the reference memory cell is shifted from 31M to 31L or 31H. When the judgment from the sense action at the first time indicates that the upper bit of the memory state is 0, the sense actin at the second time selects the reference memory cell 31L for examining whether the memory state is at 00 or 01. Alternatively, when the judgment from the sense action at the first time indicates that the upper bit of the memory state is 1, the sense actin at the second time selects the reference memory cell 31H for examining whether the memory state is at 10 or 11.

When the judgment from the sense action at the first time indicates that the upper bit of the memory state is 0 and the sense action at the second time selects the reference memory cell 31L, the current supply path 11L in the main loading circuit 11 and the current supply path 21L in the reference loading circuit 21 are selectively conducted. This allows the read-out voltage Vm corresponding to the memory state to be supplied to the main sense line 13 in the read-out voltage generator circuit 10 and the reference voltage VL to be supplied to the reference sense line 23 in the reference voltage generator circuit 20. When the memory state is 00, the I-V profile of the memory cell current Im extends lower than the I-V profile RL of the reference current IL as shown in FIG. 4 and its intersection point at the loading characteristic curve LL stays at the right side of the intersection PL between the loading characteristic curve LL and the I-V profile RL. As the result, the read-out voltage Vm determined by the voltage at the intersection point is higher than the reference voltage VL. When the memory state is at 01, the I-V profile of the memory cell current Im extends higher than the I-V profile RL of the reference current IL and its intersection point at the loading characteristic curve LL stays at the left side of the intersection PL between the loading characteristic curve LL and the I-V profile RL. As the result, the read-out voltage Vm determined by the voltage at the intersection point is lower than the reference voltage VL. It is hence judged that when the read-out voltage Vm is higher than the reference voltage VL, the lower bit of the memory state is 0 or when the read-out voltage Vm is lower than the reference voltage VL, the lower bit of the memory state is 1. The result of the judgment from the sense action at the second time is then temporarily saved in the second data latch circuit 42 as the sense output of the sense circuit 40.

Then, when the judgment from the sense action at the first time indicates that the upper bit of the memory state is 1 and the sense action at the second time selects the reference memory cell 31H, the current supply path 11H in the main loading circuit 11 and the current supply path 21H in the reference loading circuit 21 are selectively conducted. This allows the read-out voltage Vm corresponding to the memory state to be supplied to the main sense line 13 in the read-out voltage generator circuit 10 and the reference voltage VH to be supplied to the reference sense line 23 in the reference voltage generator circuit 20. When the memory state is 10, the I-V profile of the memory cell current Im extends lower than the I-V profile RH of the reference current IH as shown in FIG. 4 and its intersection point at the loading characteristic curve LH stays at the right side of the intersection PH between the loading characteristic curve LH and the I-V profile RH. As the result, the read-out voltage Vm determined by the voltage at the intersection point is higher than the reference voltage VH. When the memory state is at 11, the I-V profile of the memory cell current Im extends higher than the I-V profile RH of the reference current IH and its intersection point at the loading characteristic curve LH stays at the left side of the intersection PH between the loading characteristic curve LH and the I-V profile RH. As the result, the read-out voltage Vm determined by the voltage at the intersection point is lower than the reference voltage VH. It is hence judged that when the read-out voltage Vm is higher than the reference voltage VH, the lower bit of the memory state is 0 or when the read-out voltage Vm is lower than the reference voltage VH, the lower bit of the memory state is 1. The result of the judgment from the sense action at the second time is then temporarily saved in the second data latch circuit 42 as the sense output of the sense circuit 40.

As the two sense actions have been repeated through selectively switching the reference memory cells, the upper bit of the memory state to be temporarily saved in the first data latch circuit 41 and the lower bit of the memory state to be temporarily saved in the second data latch circuit 42 are obtained and their four-level data (of 2 bits) can be read out from the selected memory cell 3.

Second Embodiment

Figure 6:
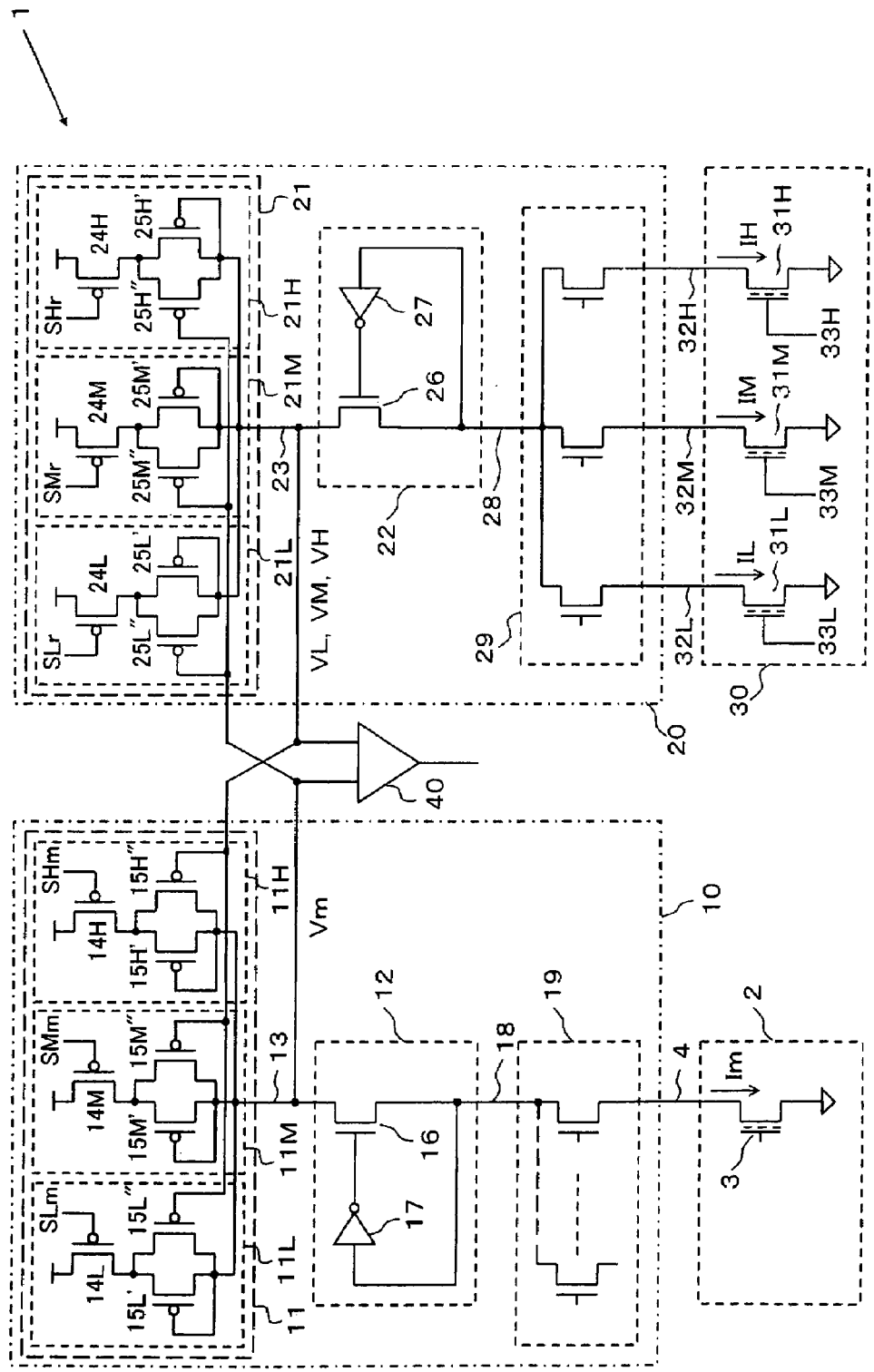
FIG. 6 is a circuitry diagram showing the second embodiment of a read-out circuit in a semiconductor memory device according to the present invention.
Figure 7:
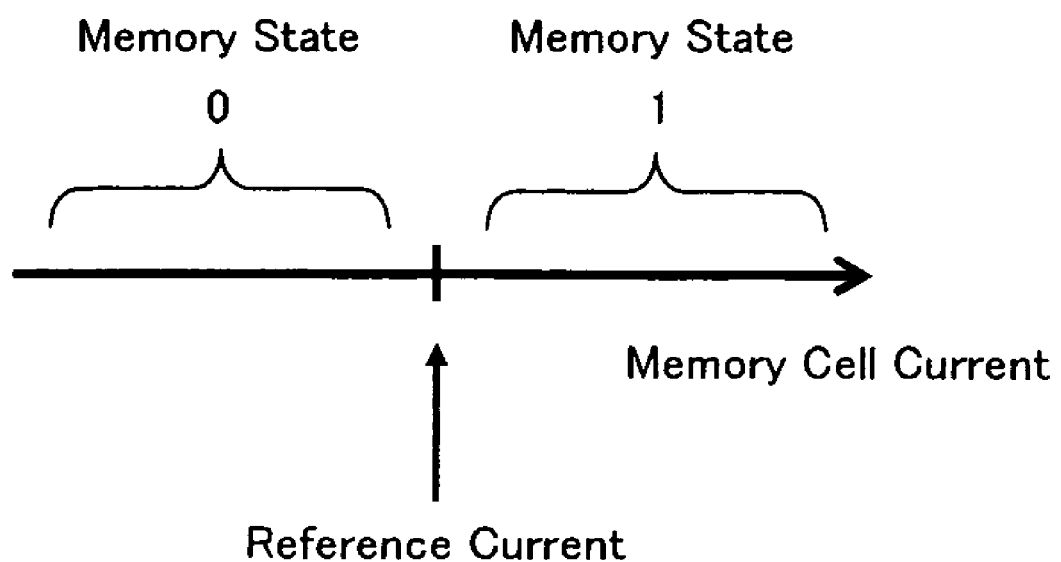
FIG. 7 illustrates an example of the relationship between the memory cell current and the memory state of two-level data in a two-level data storable semiconductor memory device.
Figure 8:
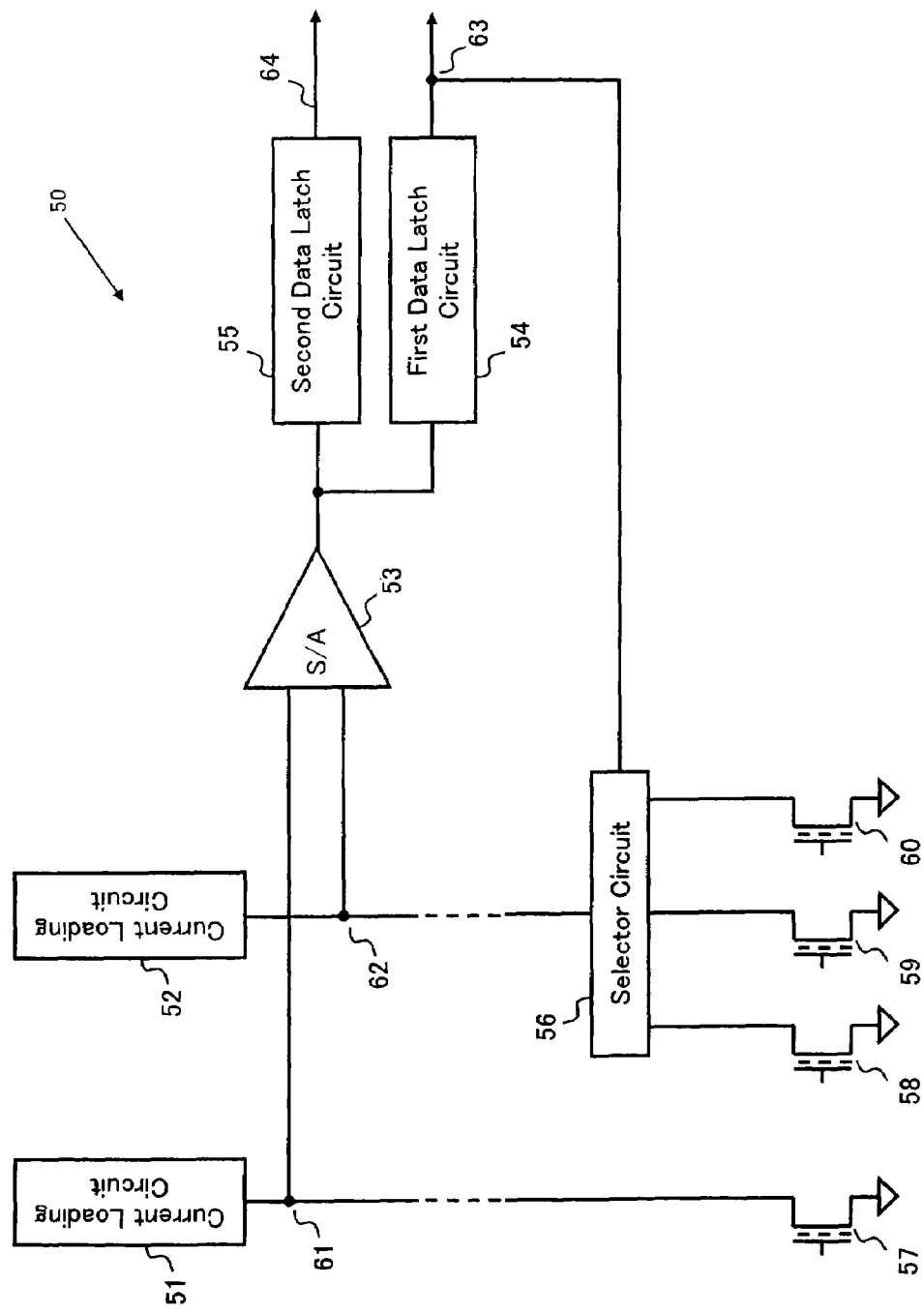
FIG. 8 is a circuitry diagram schematically showing an arrangement of a conventional read-out circuit of time-division sense type in a multilevel data storable semiconductor memory device.
Figure 9:
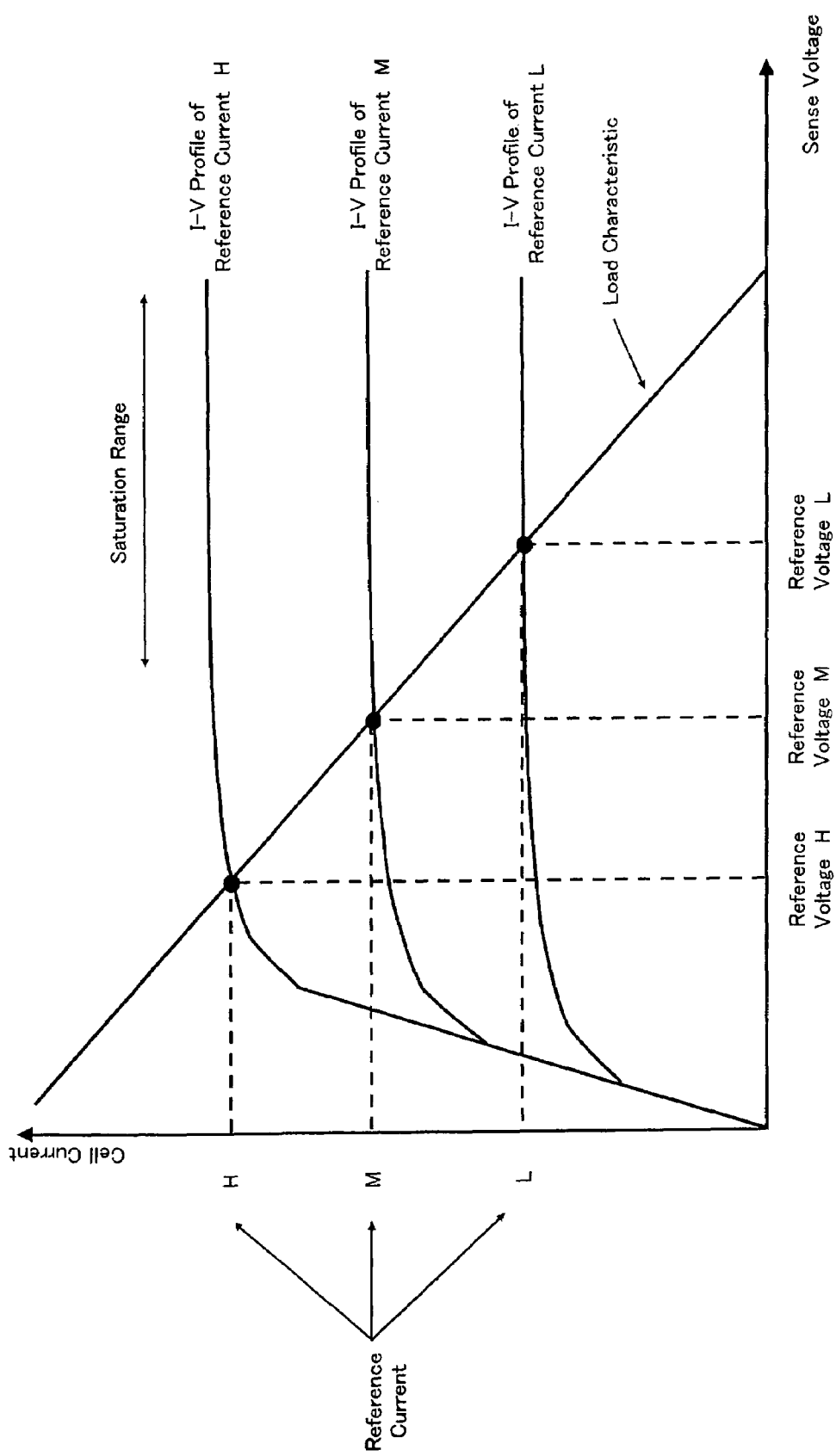
FIG. 9 is an I-V profile showing the characteristics of the action of the conventional read-out circuit in the multilevel data storable semiconductor memory device.

FIG. 6 is a circuitry diagram showing an inventive circuit 1 of the second embodiment of the present invention. The inventive circuit 1 shown in FIG. 6 includes a read-out voltage generator circuit 10, a reference voltage generator circuit 20, a reference memory cell array 30, and a sense circuit 40 which are assembled as a read-out circuit for reading a multilevel data from a selected memory cell 3 to be accessed in a memory cell array 2 where a number of multilevel data, three or more levels, storable memory cells are arranged in an array.

This embodiment is differentiated from the first embodiment by the arrangement of PMOSs 15L, 15M, and 15H in their respective current supply paths 11L, 11M, and 11H of a main loading circuit 11 in the read-out voltage generator circuit 10 and the arrangement of PMOSs 25L, 25M, and 25H in their respective current supply paths 21L, 21M, and 21H of a reference loading circuit 21 in the reference voltage generator circuit 20 which both are provided for controlling the current supply capability.

More specifically, the PMOSs 15L, 15M, and 15H in the read-out voltage generator circuit 10, which are identical to those of the first embodiment; comprise a pair of PMOSs 15L' and 15L", a pair of PMOSs 15M' and 15M", and a pair of PMOSs 15H' and 15H" respectively, each pair connected in parallel. The gate of each of the PMOSs 15L', 15M', and 15H' is connected to its drain or a main sense line 13 while the gate of each of the PMOSs 15L", 15M", and 15H" is connected to a reference sense line 23 in the reference voltage generator circuit 20.

Also, the PMOSs 25L, 25M, and 25H in the reference voltage generator circuit 20, which are identical to those of the first embodiment, comprise a pair of PMOSs 25L' and 25L", a pair of PMOSs 25M' and 25M", and a pair of PMOSs 25H' and 25H" respectively, each pair connected in parallel. The gate of each of the PMOSs 25L', 25M', and 25H' is connected to its drain or the reference sense line 23 while the gate of each of the PMOSs 25L", 25M", and 25H" is connected to the main sense line 13 in the read-out voltage generator circuit 10.

In particular, the total current supply capability of the pair of the PMOSs 15L' and 15L", the total current supply capability of the pair of the PMOSs 15M' and 15M", and the total current supply capability of the pair of the PMOSs 15H' and 15H" are arranged equal to the current supply capability of the PMOS 15L, the current supply capability of the PMOS 15M, and the current supply capability of the PMOS 15H respectively in the first embodiment. For example, the current supply capability of each of the PMOSs 15L' and 15L" is a half the current supply capability of the PMOS 15L, the current supply capability of each of the PMOSs 15M' and 15M" is a half the current supply capability of the PMOS 15M, and the current supply capability of each of the PMOSs 15H' and 15H" is a half the current supply capability of the PMOS 15H. The PMOSs 25L', 25L", 25M', 25M", 25H', and 25H" in the reference voltage generator circuit 20 are equally arranged in the current supply capability by the same manner.

The inventive circuit 1 of the second embodiment is identical in the arrangement to that of the first embodiment, except the foregoing arrangement of the main loading circuit 11 and the reference loading circuit 21. In the inventive circuit 1 of the second embodiment, the read-out voltage generator circuit 10 and the reference voltage generator circuit 20 are hence symmetrical in the arrangement as illustrated in FIG. 6.

The relationship between the read-out voltage Vm and the reference voltages VL, VM, and VH shown in FIG. 4 is applicable at a half the current supply capability of each of the main loading circuit 11 and the reference loading circuit 21. At the other half, the relationship between the read-out voltage Vm and the reference voltages VL, VM, and VH is inverted. Accordingly, the reference voltages VL, VM, and VH are varied depending on the memory state of the selected memory cell 3. However, when the read-out voltage Vm is lower than the reference voltages VL, VM, and VH, the reference voltages VL, VM, and VH shift to the higher side. When the read-out voltage Vm is higher than the reference voltages VL, VM, and VH, the reference voltages VL, VM, and VH shift to the lower side. This will increase a difference between the read-out voltage Vm and the reference voltages VL, VM, and VH, hence causing the margin of action to come large in relation to the sense circuit 40.

Some modifications of the inventive circuit will be described.

(1) In each of the above embodiments, while the three reference memory cells 31L, 31M, and 31H are provided for selection, the corresponding current supply paths 11L, 11M, and 11H are connected in parallel in the main loading circuit 11 and the corresponding current supply paths 21L, 21M, and 21H are connected in parallel in the reference loading circuit 21. The three current supply paths in each of the main loading circuit 11 and the reference loading circuit 21 may be added with one or more current supply paths for adjusting the current supply capability. Accordingly, the reference voltages VL, VM, and VH can be set to more precise levels.

(2) In each of the above embodiments, while the three reference memory cells 31L, 31M, and 31H are provided for selection, the corresponding current supply paths 11L, 11M, and 11H are connected in the main loading circuit 11 and the corresponding current supply paths 21L, 21M, and 21H are connected in the reference loading circuit 21 for selection on the one-to-one basis. For controllably determining the current supply capability of each of the main loading circuit 11 and the reference loading circuit 21, the current supply may be selected along one current supply path or a group of two or more current supply paths.

(3) In each of the above embodiments, while the three reference memory cells 31L, 31M, and 31H are provided for selection, they can be assigned with their respective reference currents. Since the selection from the three reference memory cells is intended for generating different supplies of the reference current, the assignment of one reference memory cell with one reference current may not be mandatory. For example, difference supplies of the reference current may be determined with the use of one reference memory cell or a combination of two or more reference memory cells.

(4) In the first embodiment, the current supply paths 11L, 11M, and 11H in the main loading circuit 11 and the current supply paths 21L, 21M, and 21H in the reference loading circuit 21 are connected in each pair which are equal in the current supply capability. Alternatively, the current supply paths 21L, 21M, and 21H in the reference loading circuit 21 may be increased by a desired degree. In that case, the relevant components in the current passage at the reference voltage generator circuit 20 side and the reference memory cells 31L, 31M, and 31H have to be increased in the current supply capability by the same degree.

(5) In each of the embodiments, the sense circuit 40 is a differential amplifier for amplifying a difference between the read-out voltage Vm at the selected memory cell 3 side and one of the reference voltages VL, VM and VH at the corresponding reference memory cells 31L, 31M, and 31H. The sense circuit 40 is not limited to the differential amplifier but may be an inverter which receives the read-out voltage Vm as its input signal.

Since the read-out voltage Vm is varied in reference to the reference voltages VL, VM, VH which are uniform precisely or substantially as shown in FIG. 4, its change can equally be measured with the inversion level of the inverter arranged to match the reference voltages VL, VM, and VH, regardless of the selection between the reference memory cells 31L, 31M, and 31H.

(6) In each of the embodiments, each of the current supply paths 11L, 11M, and 11H in the main loading circuit 11 and the current supply paths 21L, 21M, and 21H in the reference loading circuit 21 is implemented by PMOS for controllably determining the current path and PMOS for adjusting the current supply capability connected in series. The current supply path is not limited to the described arrangement but may be composed of any applicable circuit.

(7) In each of the embodiments, the read-out voltage generator circuit 10 includes the bit-line voltage adjusting circuit 12 while the reference voltage generator circuit 20 includes the reference bit-line voltage adjusting circuit 22. The bit-line voltage adjusting circuit 12 and the reference bit-line voltage adjusting circuit 22 may be eliminated if desired. The bit-line voltage adjusting circuit 12 and the reference bit-line voltage adjusting circuit 22 in the embodiment are provided for maintaining the bit-line voltage and the reference bit-line voltage at substantially uniform levels respectively, thus emphasizing a change in the memory cell current Vm resulting from different levels of the memory state and a difference between the reference currents IL, IM, and IH resulting from different forms of the reference memory cells.

When the I-V profile of the memory cell or the reference memory cell contains a saturated range unique to MOSFET, the action point is designated at the center of the saturated range as shown in FIG. 4. As the memory cell current Im and the reference currents IL, IM, and IH are not significantly varied regardless of a change in the voltage at the action point, both a change in the memory cell current Vm resulting from different levels of the memory state and a difference between the reference currents IL, IM, and IH resulting from different forms of the reference memory cells can clearly be notified with the absence of the bit-line voltage adjusting circuit 12 and the reference bit-line voltage adjusting circuit 22.

(8) In each of the embodiments, the memory cells are arranged for storing four-level data. The memory cells may however be provided for storing any multilevel data other than four-level data. For example, the data may have 8 or 16 different levels. In that case, the number of the reference memory cells to be selected is determined depending on the number of the levels of the memory state.

The read-out circuit in a semiconductor memory device according to the present invention can favorably be applied to a multilevel data storable semiconductor memory device where three or more levels of data is stored in each memory cell.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A read-out circuit in a semiconductor memory device for reading out multilevel data stored in a memory cell to be read that is selected from a memory cell array arranged with a plurality of memory cells capable of storing multilevel data with three or more levels, the read-out circuit comprising:

a read-out voltage generator circuit which converts a memory cell current flowing through the selected memory cell into a read-out voltage;

a reference voltage generator circuit which sequentially selects one of reference memory cells each memory state of which is intermediately assigned between two adjacent data levels of the multilevel data ordered by the memory cell current and which converts a reference current flowing through the reference memory cell into a reference voltage; and a sense circuit that amplifies a change in the read-out voltage or a difference between the read-out voltage and the reference voltage for each selection of the reference memory cells, wherein the reference voltage generator circuit includes a reference loading circuit that supplies the reference memory cell with the reference current, wherein a current supply capability of the reference loading circuit is selectively determined in response to a change in the selection of the reference memory cell so as to suppress a change in the reference voltage derived from a change in the reference current, the read-out voltage generator circuit includes a main loading circuit that supplies the selected memory cell with the memory cell current, wherein a current supply capability of the main loading circuit is selectively determined in response to a change in the selection of the reference memory cell so as to increase or decrease in proportion to the current supply capability of the reference loading circuit.

2. The read-out circuit according to claim 1, wherein the main loading circuit and the reference loading circuit are equal in the current supply capability under the same voltage condition at each of the selected reference memory cells.

3. The read-out circuit according to claim 1, wherein the reference voltage generator circuit is arranged to selectively modify the current supply capability of the reference loading circuit in response to a change in the selection of the reference memory cell so as to maintain the reference voltage at a uniform level.

4. The read-out circuit according to claim 1, wherein the main loading circuit acts as a current mirror circuit with the reference loading circuit for each selection of the reference memory cells.

5. The read-out circuit according to claim 1, wherein the main loading circuit and the reference loading circuit are connected to each other in such a manner that a current in the main loading circuit is varied depending on the reference voltage while a current in the reference loading circuit is varied depending on the read-out voltage for each selection of the reference memory cells.

6. The read-out circuit according to claim 1, wherein each of the main loading circuit and the reference loading circuit includes current supply paths each of which has a different current supply capability and can be selectively determined by on and off controlling actions for each selection of the reference memory cells.

7. The read-out circuit according to claim 6, wherein each of the current supply paths comprises a MOSFET for the on and off controlling action and a MOSFET for modifying the current supply capability and these MOSFETs are connected in series.

8. The read-out circuit according to claim 6, wherein the number of the current supply paths or their combination in each of the main loading circuit and the reference loading circuit is equal to or greater than the selectable number of the reference memory cells.

9. The read-out circuit according to claim 1, wherein each of the main loading circuit and the reference loading circuit includes a plurality of current supply paths which can be controlled by on and off action so that the current supply capability can be desirably modified through selectively determining a combination of the current supply paths by on and off controlling actions for each selection of the reference memory cells.

10. The read-out circuit according to claim 9, wherein each of the current supply paths comprises a MOSFET for the on and off controlling action and a MOSFET for modifying the current supply capability and these MOSFETs are connected in series.

11. The read-out circuit according to claim 9, wherein the number of the current supply paths or their combination in each of the main loading circuit and the reference loading circuit is equal to or greater than the selectable number of the reference memory cells.

12. The read-out circuit according to claim 1, wherein the reference memory cell to be selected next is determined in response to the output level of the sense circuit for the selected reference memory cell.

* * * * *